United States Patent [19]

Roane

[11] Patent Number: 4,873,565

[45] Date of Patent: Oct. 10, 1989

[54] METHOD AND APPARATUS FOR PROVIDING INTERCONNECTION BETWEEN METALLIZATION LAYERS ON SEMICONDUCTOR DEVICES

[75] Inventor: Bobby A. Roane, Manvel, Tex.

[73] Assignee: Texas Instruments Incorporated, Dallas, Tex.

[21] Appl. No.: 115,282

[22] Filed: Nov. 2, 1987

[51] Int. Cl.⁴ .............. H01L 23/48; H01L 45/00; H01L 29/04
[52] U.S. Cl. ......................... 357/71; 357/69; 437/191; 437/192; 437/189
[58] Field of Search .................. 357/71, 69; 437/191, 437/192, 189

[56] References Cited

U.S. PATENT DOCUMENTS

| | | | |
|---|---|---|---|
| 3,290,565 | 12/1966 | Hastings | 437/192 |
| 3,508,118 | 4/1970 | Merrin | 357/71 |
| 4,725,877 | 2/1988 | Brasen | 357/67 |

Primary Examiner—Andrew J. James
Assistant Examiner—David Soltz
Attorney, Agent, or Firm—Thomas R. FitzGerald; Leo N. Heiting; Melvin Sharp

[57] ABSTRACT

A metal stud (24) is provided for interconnecting levels of metallization separated by an insulator on a semiconductor slice (10). A lead (12) is coated with a refractory metal (14) and a platable metal cap (16). A photoresist (18) is then applied and a cavity (22) is formed within the photoresist (18). The cavity (22) is plated to form the stud (24). The stud (24) is clad with a corrosion resistant layer (28).

13 Claims, 1 Drawing Sheet

U.S. Patent    Oct. 10, 1989    4,873,565
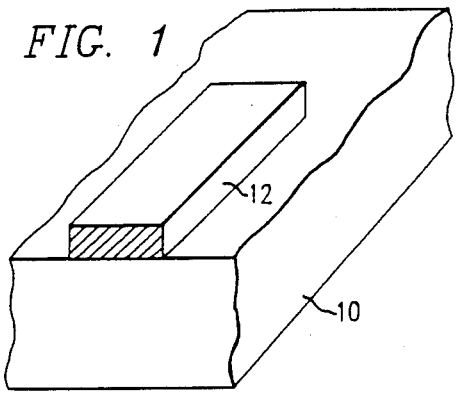
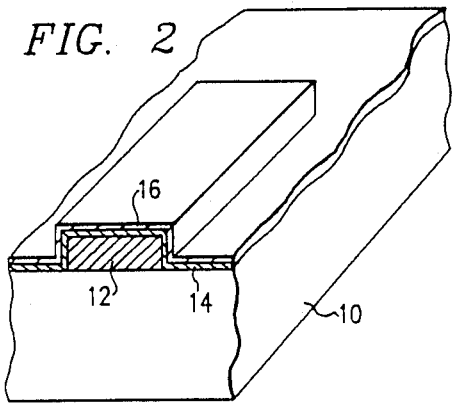
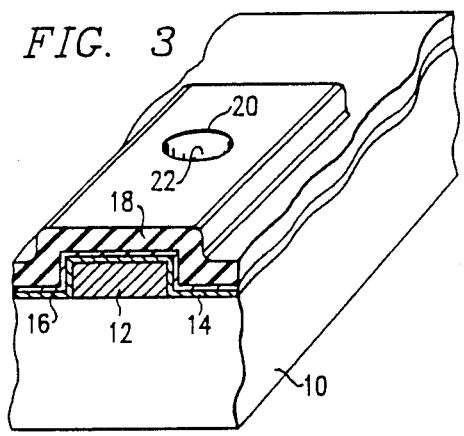
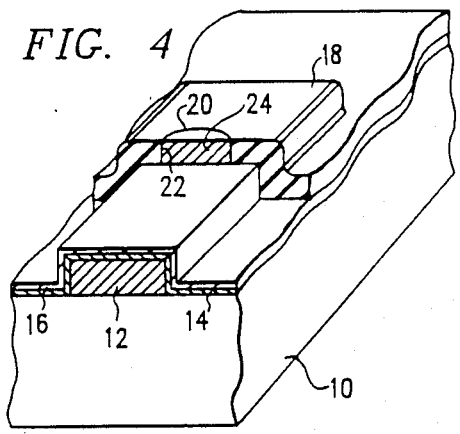
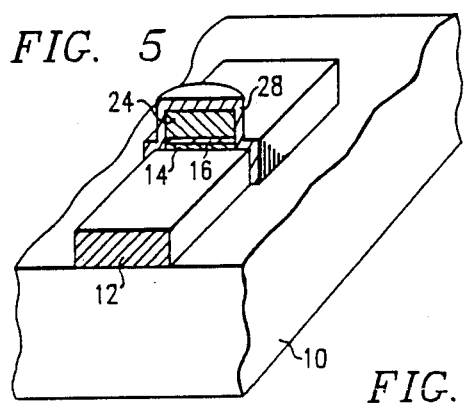
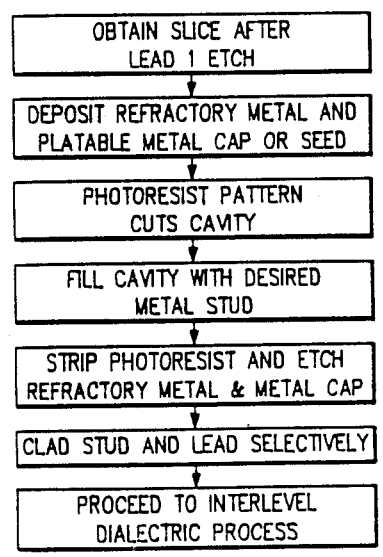

METHOD AND APPARATUS FOR PROVIDING INTERCONNECTION BETWEEN METALLIZATION LAYERS ON SEMICONDUCTOR DEVICES

TECHNICAL FIELD OF THE INVENTION

This invention relates in general to semiconductor devices and in particular to a method and apparatus for providing interconnection between metallization layers separated by an insulator on semiconductor devices.

BACKGROUND OF THE INVENTION

In the fabrication of semiconductor devices, several levels of metallization are built on top of each other and separated by an insulating layer which prevents interference from one level to the next. If it is desired to provide an electrical contact between the various levels at a prescribed location, a conductor must pass through the insulating layer and make contact with each level of metallization.

In the past, a first level was fabricated and then covered with an insulating layer. A hole having vertical sidewalls was then cut through the insulating layer at the prescribed location and the next level of metallization was applied on top of the insulating layer. The conventional methods of sputtering or evaporating a conformed layer of metallization resulted in the even application of a thin layer of metal applied to all exposed surfaces. Occasionally, the metallization was applied too thinly in the hole, due to the sheer drop of the vertical sidewalls between the levels, and a reliability problem developed due to insufficient metal in the hole to carry the current.

One attempt to solve this reliability problem has been to use tapered sidewalls in the hole. The first level of metallization was covered with an insulating layer in the same manner as before, but instead of cutting a hole with vertical sidewalls, a sloping or tapered sidewall was cut. This resulted in a hole with a larger diameter at the top surface where the second level of metallization was to be applied than at the bottom surface proximate the first level of metallization. The elimination of the sheer drop through the insulating layer allowed more metal to flow into the hole, resulting in the application of a thicker conductor which reduced occurences of the previous reliability problem.

Unfortunately, this solution of one problem led to the creation of another. As semiconductor devices have become more sophisticated, surface area has become a premium. The more space utilized for nonfunctional purposes, such as tapered sidewall holes, the less space there is for an electronic circuit. Therefore, the increased use of space by tapering the sidewalls has become an undesirable waste of limited surface area. Thus, a need has arisen for an interconnection between metallization layers of a semiconductor device separated by an insulator that is reliable and yet does not waste space.

SUMMARY OF THE INVENTION

The present invention disclosed and claimed herein describes a method and apparatus for the interconnecting metallization levels separated by an insulator on semiconductor devices which substantially eliminates problems associated with prior techniques of connecting levels. The present invention provides for the building of a protruding metal stud to serve as the interconnect between the levels on the semiconductor device.

In one aspect of the present invention, a solid stud is formed over a lead on a first level of metallization and is separated from the lead by a diffusion barrier. The stud extends through the insulator, which is applied over the first level and the stud, and connects a second level of metallization to the first level.

In another aspect of the present invention, a semiconductor slice having been through a first level lead process has a refractory metal and a platable metal cap or seed deposited on it to form a diffusion barrier. The semiconductor slice is then coated with photoresist and a cavity is formed in the photoresist. The cavity is plated with the desired metal stud to the height required by the design of the semiconductor device.

The remaining photoresist is stripped from the surface of the silicon slice exposing the diffusion barrier and the metal stud. The refractory metal is then etched to expose the first level lead and leave the stud and the diffusion barrier under it. The first level lead and the stud are then selectively clad. It is a technical advantage of the present invention in that it allows the first level lead and the stud to be clad on all exposed surfaces, including the sidewalls which will assist in preventing corrosion of the lead or the stud. The semiconductor slice is then coated with an insulator and the second level of metallization is added. The second level may be connected to the first level through the insulator by exposing the top of the stud.

It is another technical advantage of the present invention in that it is equally applicable to various metal lead technologies. The present invention may be utilized with leads of, for example, aluminum, copper and aluminum-copper alloy. It is still a further technical advantage that the present invention may be utilized with any insulator material technology, such as, for example, plasma, chemical vapor deposition or oxide-nitride. Finally, it is a technical advantage of the present invention to provide a solid conductor between levels of metallization without wasting any semiconductor slice surface space.

BRIEF DESCRIPTION OF THE DRAWINGS

For a more complete understanding of the present invention and for further advantages thereof, reference is now made to the following detailed description taken in conjunction with the accompanying drawings in which:

FIG. 1 is a perspective view of a silicon semiconductor slice with a first lead attached;

FIG. 2 is the perspective view of FIG. 1 with a refractory metal and metal cap added to it;

FIG. 3 is the perspective view of FIG. 2 showing the photoresist layer and a cavity formed in it;

FIG. 4 is the perspective view of FIG. 3 with the stud added to the cavity;

FIG. 5 is a perspective view showing the completed semiconductor slice in accordance with the present invention; and FIG. 6 is a flow chart of the fabrication steps utilized in the present invention.

DETAILED DESCRIPTION OF THE INVENTION

In the following description, like items in the various figures are identified by like and corresponding numerals for ease of reference. Referring to FIG. 1, a section of a silicon semiconductor slice 10 is shown after a first level lead 12 has been formed on its surface. While not shown, the lead 12 is insulated from the slice 10 by an insulator, such as, for example, silicon oxide or nitride. The first level lead 12 is formed by any standard process such as, for example, sputtering or evaporating the metal onto the slice, patterning, and etching the metal to define a conductor between circuits. The first level lead 12 may be aluminum, aluminum-copper or any other suitable lead material.

FIG. 2 shows the section of the silicon slice 10 and the first level lead 12 after a refractory metal 14 and platable metal cap 16 have been added. The refractory metal 14 and the platable metal cap 16 are added to the first level lead 12 by covering the entire surface of the slice 10. The refractory metal 14 and the platable metal cap 16 are formed by a standard process, such as, for example, sputtering. The platable metal cap 16 is sputtered onto the lead 12 and the slice 10 immediately after the refractory metal 14 is sputtered on and without breaking a vacuum in the sputtering device. It is desireable to have no gaps between the refractory metal 14 and the platable metal cap 16 since a gap would cause unwanted resistence. The refractory metal 14 can be, for example, molybdenum, chromium, tantalum, tungsten or titanium-tungsten. The refractory metal 14 and the platable metal cap 16 serve as a diffusion barrier as will be discussed in more detail below. Due to the unplatability of the refractory metal 14, the seed layer or platable metal cap 16 is placed over the top of the refractory metal 14. The metal cap 16 may be, for example, gold, copper or silver.

FIG. 3 represents the next step in the process of the present invention. The entire surface of the slice 10, the first level lead 12, the refractory metal 14 and the metal cap 16 are now covered with a photoresist 18. The photoresist 18 is spun on, for example, in a resist spinner or a coater. The photoresist 18 is a conventional photosensitive organic material in which a light source is used to expose the photoresist 18. A mask, not shown, containing the desired pattern 20 is used to expose the photoresist 18 except where the pattern 20 is to appear. The unexposed portion of the photoresist 18 becomes soluble in a developer compound while the unexposed portion remains insoluble. This unexposed portion of pattern 20 is then removed by a developer compound creating a cavity 22 while leaving the photoresist 18 on the rest of the semiconductor slice 10. The cavity 22 forms a cylindrical hole in the photoresist 18 down to the top of the platable metal cap 16. Although not shown, it is to be understood that the cavity 22 could form a square hole or any other desired geometric shape.

FIG. 4 depicts the next step in the process utilizing the present invention. The cavity 22 has been plated with the metal stud 24. The metal stud 24 is preferably plated by an electroplating device (not shown) in which, for example, the metal to be plated is an anode in a chemical solution and the slice 10 is a cathode. When an electric current is passed through the chemical solution, the anode is dissolved and redeposited on the cathode. The stud 24 may also be plated by any other appropriate method, such as, for example, electroless plating or emersion plating. The metal stud 24 may be copper, gold, nickel-copper alloy, nickel-gold alloy, or any other material that can be used in plating procedures. The height of the stud 24 is determined by the design requirements of the semiconductor device and is regulated by how long the slice 10 is exposed to the plating process.

The photoresist 18 must now be stripped from the surface of the semiconductor slice 10. The stripping of the photoresist 18 is by any appropriate method, not shown, such as, for example, a chemical wet strip or a dry strip depending upon the type of metals involved in the various levels. Once the photoresist 18 is removed, the metal stud 24 remains protruding above the refractory metal 14 and the platable metal cap 16. The refractory metal 14 and the platable metal ca 16 are now etched to remove them from the slice 10. The etching is conducted in, for example, a reactive ion etcher such as a magnetron etcher, not shown, which is well known in the art. Argon gas is used to etch the platable metal cap 16, and sulfur hexaflouride plus Freon-11 is used to remove the refractory metal 14 without removing the first level lead 12 or the silicon oxide (not shown). The refractory metal 14 and the platable metal cap 16 are not removed from under the stud 24 since the stud 24 acts as an etch stop. The remaining refractory metal 14 and metal cap 16 under the stud 24 form a diffusion barrier between the stud 24 and the lead 12. The diffusion barrier prevents the diffusion of the stud 24 into the material of the first level lead 12 which could occur at the operating temperatures, for example, 500° C., of the semiconductor.

The stud 24 and the first level lead 12 are now selectively clad with a layer 28 as shown in FIG. 5. A low pressure chemical vapor deposition process, as is well known in the art, is used to clad the stud 24 and the lead 12 by heating the slice 10 to approximately 300° C. and then passing gases, including a gas containing the material for the layer 28, over the slice 10. The material for the layer 28, for example, tungsten or molybdenum, is pulled from the gas and deposited on the heated surface of the slice 10 and the remaining gases are removed. The term selective is herein defined to mean all exposed metallic surfaces, i.e., the first level lead 12 and the stud 24 (and not the silicon oxide field). It is a technical advantage of the present invention that all exposed metallic surfaces are clad, including the vertical surfaces of the first level lead 12, which will prevent corrosion if the device should come into contact with a corrosive agent, such as, for example, chlorine.

From this point, it is possible to proceed with a standard interlevel dielectric process such as coating the device with an insulator layer by plasma enhancement or chemical vapor deposition. A second level of metallization may then be applied by the same procedure as the first level, i.e. sputtering, and the first level will be connected to the second level by the stud 24.

FIG. 6 depicts a step-by-step application of the process of the present invention:

Step 1: Obtain a silicon semiconductor slice after a first level lead has been formed;

Step 2: Deposit a refractory metal and a platable metal cap or seed on the slice and the first level lead;

Step 3: Apply photoresist over the refractory metal and metal cap and form a cavity;

Step 4: Fill the cavity with the desired metal to form a stud;

Step 5: Strip the photoresist and etch the refractory metal and metal cap;

Step 6: Selectively clad the stud and the first level lead; and

Step 7: Proceed with an interlevel dielectric process.

Although the present invention has been described with respect to a specific preferred embodiment thereof, various changes and modifications may be suggested to one skilled in the art and it is intended that the present invention encompass such changes and modifications as fall within the scope of the appended claims.

What is claimed is:

1. A semiconductor device interconnection between first and second metallization levels separated by an insulator, comprising:
   a solid stud with vertical sidewalls extending from the first level of metallization through the insulator into contact with the second level of metallization;
   said stud clad with a corrosion-preventing material on said vertical sidewalls and a top surface thereof.

2. The interconnection of claim 1, wherein said metallization layers are formed on a silicon semiconductor slice substrate.

3. The interconnection of claim 1, wherein said stud is separated from the first level by a diffusion barrier comprising a refractory metal covered with a platable metal cap.

4. The interconnection of claim 1, wherein said stud comprises a plated conductor.

5. The interconnection of claim 1, wherein said corrosion preventing material comprises tungsten.

6. The interconnection of claim 1, wherein said corrosion preventing material comprises molybdenum.

7. An apparatus for interconnecting spaced apart metallization levels on a semiconductor substrate, comprising:
   an oxide field formed on the semiconductor substrate;
   a first level of metallization forming a predesignated lead over said oxide field;
   a diffusion barrier formed over said lead;
   a conductor having vertical sidewalls extending from said diffusion barrier;
   a corrosion-resistant layer over said predesignated lead, said vertical sidewalls and a top surface of said conductor;
   an insulator over said first level and said conductor so that said conductor protrudes through said insulator; and
   a second metallization level over said insulator so that said conductor interconnects the first level of metallization with said second level of metallization.

8. The apparatus for interconnecting metallization levels of claim 7, wherein said predesignated lead comprises aluminum.

9. The apparatus for interconnecting metallization levels of claim 7, wherein said predesignated lead comprises an aluminum-copper alloy.

10. The apparatus for interconnecting metallization levels of claim 8, wherein said predesignated lead comprises a sputtered on metal.

11. The apparatus for connecting metallization levels of claim 8, wherein said predesignated lead comprises an evaporated on metal.

12. The apparatus for interconnecting metallization levels of claim 8, wherein said diffusion barrier comprises a sputtered on platable metal cap over a sputtered-on refractory metal.

13. The apparatus for interconnecting metallization levels of claim 7, wherein said conductor comprises a plated metal stud formed in a patterned photoresist cavity.

* * * * *